(12) United States Patent
Hamada et al.

(10) Patent No.: US 10,340,314 B2
(45) Date of Patent: Jul. 2, 2019

(54) ORGANIC LIGHT-EMITTING DIODE DISPLAY PANEL, ELECTRONIC DEVICE AND MANUFACTURING METHOD

(71) Applicants: Shanghai Tianma AM-OLED Co., Ltd., Shanghai (CN); Tianma Micro-Electronics Co., Ltd., Shenzhen (CN)

(72) Inventors: Yuji Hamada, Shanghai (CN); Wanming Hua, Shanghai (CN); Xiangcheng Wang, Shanghai (CN); Wei He, Shanghai (CN); Jinghua Niu, Shanghai (CN); Zhihong Lei, Shanghai (CN)

(73) Assignees: Shanghai Tianma AM-OLED Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 74 days.

(21) Appl. No.: 15/434,159

(22) Filed: Feb. 16, 2017

(65) Prior Publication Data

US 2017/0162631 A1 Jun. 8, 2017

(30) Foreign Application Priority Data

Nov. 24, 2016 (CN) .......................... 2016 1 1050888

(51) Int. Cl.
*H01L 51/50* (2006.01)
*H01L 27/32* (2006.01)
*H01L 51/00* (2006.01)
*H01L 51/52* (2006.01)
*H01L 51/56* (2006.01)

(52) U.S. Cl.
CPC ...... *H01L 27/3211* (2013.01); *H01L 51/0021* (2013.01); *H01L 51/5004* (2013.01);
(Continued)

(58) Field of Classification Search
CPC ....... H01L 2251/301; H01L 2251/5315; H01L 2251/552; H01L 2251/558; H01L 51/0081; H01L 51/5016; H01L 51/5203
(Continued)

(56) References Cited

U.S. PATENT DOCUMENTS

| 8,476,624 | B1* | 7/2013 | Wu ...................... H01L 51/5004 257/40 |
| 2006/0290270 | A1* | 12/2006 | Kim ..................... H01L 51/5221 313/503 |

(Continued)

FOREIGN PATENT DOCUMENTS

| CN | 101359721 A | 2/2009 |
| CN | 103872088 A | 6/2014 |

(Continued)

*Primary Examiner* — Long K Tran
(74) *Attorney, Agent, or Firm* — Anova Law Group, PLLC

(57) ABSTRACT

The present disclosure provides an OLED display panel, an electronic device, and a manufacturing method. The OLED display panel comprises a substrate, and a plurality of pixel regions formed on the substrate to emit light of different colors. A pixel region includes a first electrode, a light-emitting function layer, and a second electrode, configured facing away from the substrate. The second electrode is a light-emitting side electrode of the OLED display panel. Differences in transmittances at different wavelengths of the second electrode satisfy the following equations: $|T(450\ nm)-T(530\ nm)|\leq 15\%$, $|T(610\ nm)-T(530\ nm)|\leq 15\%$, and $|T(400\ nm)-T(700\ nm)|\leq 50\%$, where $T(X\ nm)$ is a transmittance at a wavelength of $X\ nm$ of the second electrode.

15 Claims, 5 Drawing Sheets

(52) U.S. Cl.
CPC ...... *H01L 51/5016* (2013.01); *H01L 51/5203* (2013.01); *H01L 51/5234* (2013.01); *H01L 51/56* (2013.01); *H01L 51/005* (2013.01); *H01L 51/0059* (2013.01); *H01L 51/0072* (2013.01); *H01L 51/0081* (2013.01); *H01L 51/0085* (2013.01); *H01L 51/5265* (2013.01); *H01L 2251/301* (2013.01); *H01L 2251/5315* (2013.01); *H01L 2251/552* (2013.01); *H01L 2251/558* (2013.01)

(58) Field of Classification Search
USPC .......................................................... 257/40
See application file for complete search history.

(56) References Cited

U.S. PATENT DOCUMENTS

| | | | |
|---|---|---|---|
| 2011/0032622 A1* | 2/2011 | Kim | G02B 5/285 359/609 |
| 2011/0133125 A1* | 6/2011 | Shirata | C09K 11/873 252/301.4 R |
| 2011/0266531 A1* | 11/2011 | Kim | H01L 51/005 257/40 |
| 2014/0183482 A1 | 7/2014 | Lee et al. | |
| 2015/0171366 A1* | 6/2015 | Kim | H01L 51/5246 257/40 |
| 2016/0005992 A1* | 1/2016 | Song | H01L 51/5275 257/40 |
| 2016/0056214 A1* | 2/2016 | Pyo | H01L 27/3211 257/40 |

FOREIGN PATENT DOCUMENTS

| | | |
|---|---|---|
| CN | 104078617 A | 10/2014 |
| CN | 104952908 A | 9/2015 |
| CN | 105355802 A | 2/2016 |

\* cited by examiner

ORGANIC LIGHT-EMITTING DIODE DISPLAY PANEL, ELECTRONIC DEVICE AND MANUFACTURING METHOD

CROSS-REFERENCES TO RELATED APPLICATIONS

This application claims the priority of Chinese Patent Application No. CN201611050888.5, filed on Nov. 24, 2016, the entire contents of which are incorporated herein by reference.

FIELD OF THE DISCLOSURE

The present disclosure generally relates to the display technology and, more particularly, relates to an organic light-emitting diode display panel, an electronic device and a manufacturing method.

BACKGROUND

Organic light emitting diode, or OLED, is also known as organic electroluminescent device, which refers to a phenomenon of light emission due to carrier injection and recombination inside a light-emitting material when driven by an electric field. As compared with liquid crystal displays, or LCDs, OLED devices are lighter and thinner, have wider viewing angles and higher contrast ratios, etc. and, thus, become very popular.

Based on light emission directions in the OLED display panel structure, OLED display panels may be divided into a top emission type, a bottom emission type, and a double emission type. Compared with the bottom emission type, the top emission type may have a higher quantum efficiency and narrower emission spectrum, i.e., a higher luminous efficiency and color purity. In the existing technology, the top emission type of OLED display panel often uses a low Ag-doped MgAg alloy for a translucent cathode, which has a transmittance of about 33% for red light (610 nm), a transmittance of about 40% for green light (530 nm), and a transmittance of about 50% for blue light (450 nm). In the existing technology, the transmittance of cathode material decreases significantly with the increase of the wavelength, causing significant differences in the transmittance of the cathode material of the OLED display panels in different wavelengths.

The disclosed OLED display panel, electronic device and manufacturing method are directed to solve one or more problems set forth above and other problems.

BRIEF SUMMARY OF THE DISCLOSURE

One aspect of the present disclosure includes an organic light-emitting diode (OLED) display panel. The OLED display panel comprises a substrate, and a plurality of pixel regions formed on the substrate to emit light of different colors. A pixel region includes a first electrode, a light-emitting function layer, and a second electrode, configured facing away from the substrate. The second electrode is a light-emitting side electrode of the OLED display panel. Differences in transmittances at different wavelengths of the second electrode satisfy the following equations: $|T(450\text{ nm})-T(530\text{ nm})|\leq 15\%$, $|T(610\text{ nm})-T(530\text{ nm})|\leq 15\%$, and $|T(400\text{ nm})-T(700\text{ nm})|\leq 50\%$, where $T(X\text{nm})$ is a transmittance at a wavelength of Xnm of the second electrode.

Another aspect of the present disclosure provides an electronic device, comprising the disclosed OLED display panel.

Another aspect of the present disclosure provides a manufacturing method for a disclosed OLED display panel. The manufacturing method comprises forming a first electrode on a substrate including a plurality of pixel regions having different emission colors, forming a light-emitting function layer on the first electrode, and forming a second electrode layer on the light-emitting function layer, wherein differences in transmittances at different wavelengths of the second electrode satisfy the following equations: $|T(450\text{ nm})-T(530\text{ nm})|\leq 15\%$, $|T(610\text{ nm})-T(530\text{ nm})|\leq 15\%$, and $|T(400\text{ nm})-T(700\text{ nm})|\leq 50\%$, where $T(X\text{nm})$ is a transmittance at a wavelength of Xnm of the second electrode.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
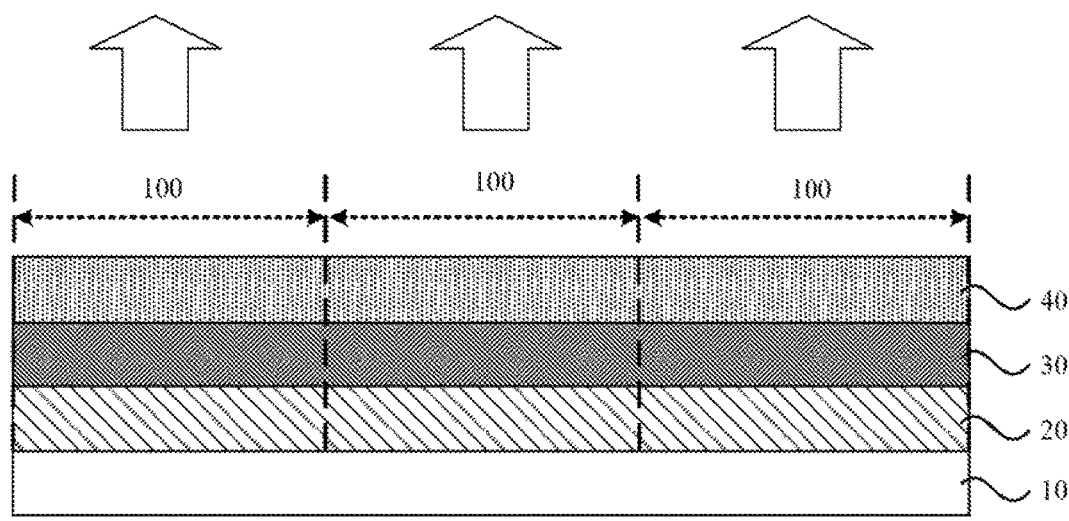
FIG. 1 illustrates a cross-sectional view of an exemplary organic light-emitting (OLED) display panel according to the disclosed embodiments.

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings.

The various embodiments of the present invention provide an OLED display panel, including a plurality of pixel regions of different light-emission colors formed on a substrate. Each pixel region includes a first electrode configured facing away from the substrate, a light-emitting function layer, and a second electrode. The second electrode is an emission-side electrode of the OLED display panel. The difference in transmittance of each wavelength of the second electrode satisfies the following equations:

$$|T(450\ nm) - T(530\ nm)| \leq 15\%; \quad (1)$$

$$|T(610\ nm) - T(530\ nm)| \leq 15\%;\ and \quad (2)$$

$$|T(400\ nm) - T(700\ nm)| \leq 50\%; \quad (3)$$

where, T(Xnm) is a transmittance at a wavelength Xnm of the second electrode.

The light-emitting function layer of the OLED display panel may be formed by a deposition method. The first and the second electrodes of the OLED display panel may be formed by a deposition method, a sputtering method, a vapor deposition method, an ion beam deposition method, an electron beam deposition method, or a laser ablation method.

In one embodiment, the absolute difference between a transmittance at the wavelength 450 nm of the second electrode and a transmittance at the wavelength 530 nm of the second electrode may be configured to be smaller than or equal to about 15%, the absolute difference between a transmittance at the wavelength 610 nm of the second electrode and a transmittance at the wavelength 530 nm of the second electrode may be configured to be smaller than or equal to about 15%, and the absolute difference between a transmittance at the wavelength 400 nm of the second electrode and a transmittance at the wavelength 700 nm of the second electrode may be configured to be smaller than or equal to about 50%.

Thus, the differences of the transmittances at different light wavelength bands of the second electrode may be reduced, the efficiencies and color shifts in different light wavelength bands may be assured to be sufficiently consistent, the differences of the cathode material transmittances at different wavelengths for the OLED display panel may be reduced, and the light-emitting efficiency of the OLED display panel over the entire visible light range may be improved.

Various embodiments of the disclosure will be described in clarity and entirety with the accompanying drawings. Based on the embodiments of the present disclosure, all other embodiments obtained by those skilled in the art without the inventive effort are within the scope of the present disclosure.

FIG. 1 illustrates a cross-sectional view of an exemplary OLED display panel according to the present disclosure. As shown in FIG. 1, the OLED display panel may comprise a substrate 10, and a plurality of pixel regions 100 formed on the substrate 10 to emit light of different colors. Each pixel region 100 may include a first electrode 20, a light-emitting function layer 30, and a second electrode 40. The first electrode 20, the light-emitting function layer 30, and the second electrode 40 may be disposed facing away from the substrate 10.

The second electrode 40 may be a light-emitting side electrode of the OLED display panel. In one embodiment, as shown in FIG. 1, the OLED display panel may be a top emission type, and the direction of an arrow in FIG. 1 points to the light emitting direction. The differences in transmittances at different wavelengths of the second electrode 40 may satisfy the following equations:

$$|T(450\ nm) - T(530\ nm)| \leq 15\%; \quad (1)$$

$$|T(610\ nm) - T(530\ nm)| \leq 15\%;\ and \quad (2)$$

$$|T(400\ nm) - T(700\ nm)| \leq 50\%; \quad (3)$$

where, T(Xnm) is a transmittance at a wavelength Xnm of the second electrode 40, for example, T(450 nm) is the transmittance at the wavelength 450 nm of the second electrode 40.

The above equations (1)-(3) indicate that the absolute difference between a transmittance at the wavelength 450 nm of the second electrode 40 and a transmittance at the wavelength 530 nm of the second electrode 40 is smaller than or equal to about 15%, the absolute difference between a transmittance at the wavelength 610 nm of the second electrode 40 and a transmittance at the wavelength 530 nm of the second electrode 40 is smaller than or equal to about 15%, and the absolute difference between a transmittance at the wavelength 400 nm of the second electrode 40 and a transmittance at the wavelength 700 nm of the second electrode 40 is smaller than or equal to about 50%.

Under the condition that the electric characteristics of the second electrode 40 is assured, to keep a desired small difference in the transmittances in different light wavelength bands of the second electrode 40, assure the efficiencies and color shifts in different wavelength bands to be sufficiently consistent, and improve the light-emitting efficiency of the OLED display panel over the entire visible light range, the differences in transmittances at different wavelengths of the second electrode 40 may be configured to satisfy the following equations through further adjusting the material of the second electrode 40:

$$|T(450\ nm) - T(530\ nm)| \leq 10\%; \quad (4)$$

$$|T(610\ nm) - T(530\ nm)| \leq 10\%;\ and \quad (5)$$

$$|T(400\ nm) - T(700\ nm)| \leq 40\%. \quad (6)$$

In certain embodiments, provided that the second electrode 40 is assured to have a substantially low resistance, the minimum transmittance in the visible light wavelength band of the second electrode 40 may be configured to be greater than or equal to about 40% to improve the light-emitting efficiency of the OLED display panel.

Figure 2:
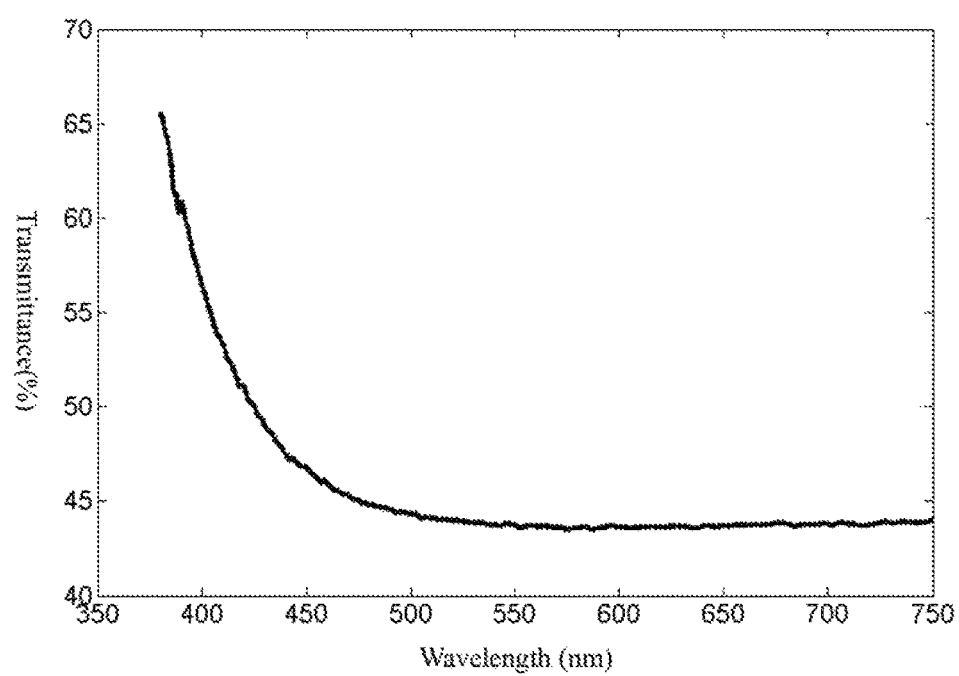
FIG. 2 illustrates a transmittance measurement chart for an exemplary pure Ag second electrode according to the disclosed embodiments.

In one embodiment, the second electrode 40 may be made of Ag. FIG. 2 illustrates a transmittance measurement chart for an exemplary pure Ag second electrode according to the present disclosure. Referring to FIG. 2, when the second electrode 40 is made of pure Ag, the blue light at the wavelength 450 nm has a transmittance of about 46.7%, the green light at the wavelength 530 nm has a transmittance of about 43.8%, and the red light at the wavelength 610 nm has a transmittance of about 43.6%. The differences in the transmittances of light in three different colors are not big. In addition, the differences in the transmittances of light in the wavelength band between 450 nm and 750 nm are insignificant.

In another embodiment, the second electrode 40 may be made of a metal alloy containing Ag. For example, the Ag containing metal alloy may further contain at least one of Mg, Yb, an alkali metal element, an alkaline earth metal element, or a rare earth element. In certain embodiments, when the second electrode is made of Ag containing metal alloy, the Ag content in the second electrode material may be configured to be greater than or equal to about 90%. As the Ag content increases, the transmittance curve of second electrode made of Ag containing metal alloy may approach the transmittance curve of the of second electrode made of pure Ag, such that the differences in transmittances of light in different colors may be minimized, and the light-emitting efficiencies in the pixel regions of different colors may be balanced.

Figure 3:
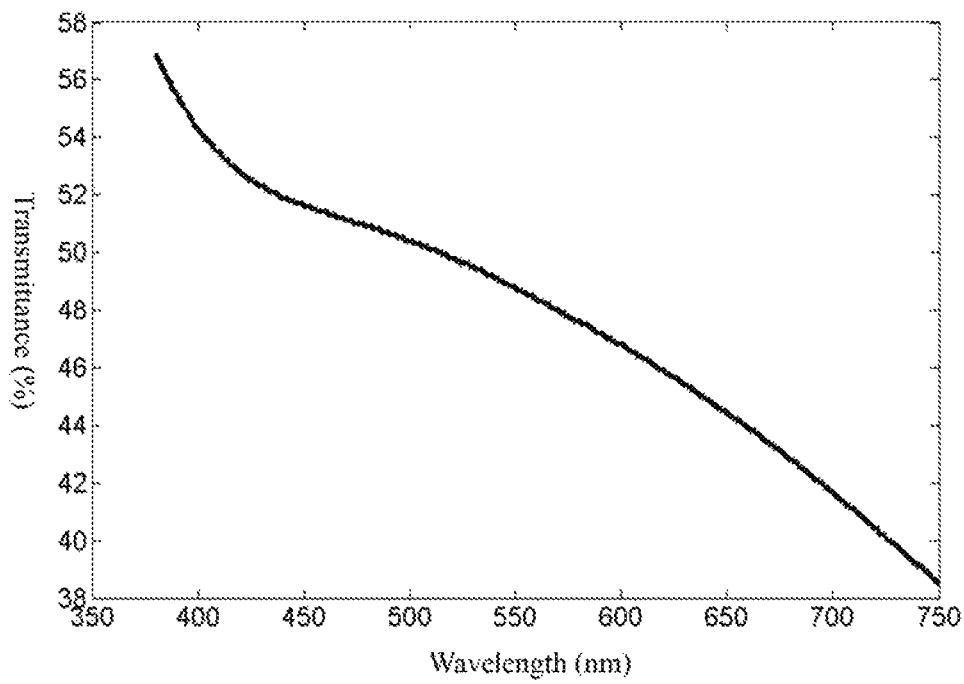
FIG. 3 illustrates a transmittance measurement chart for an exemplary MgAg alloy second electrode according to the disclosed embodiments.

FIG. 3 illustrates a transmittance measurement chart for an exemplary MgAg alloy second electrode according to the present disclosure. The weight percentage ratio of the Mg content and Ag content in the MgAg alloy is about 1:9. Referring to FIG. 3, the second electrode has a transmittance of about 51.56% at the wavelength 450 nm, a transmittance of about 49.5% at the wavelength 530 nm, and a transmittance of about 46.4% at the wavelength 610 nm. That is, the differences in the transmittances of light in three different colors are not big. Further, the differences in the transmittances of light in the wavelength band between 450 nm and 750 nm are insignificant.

Figure 4:
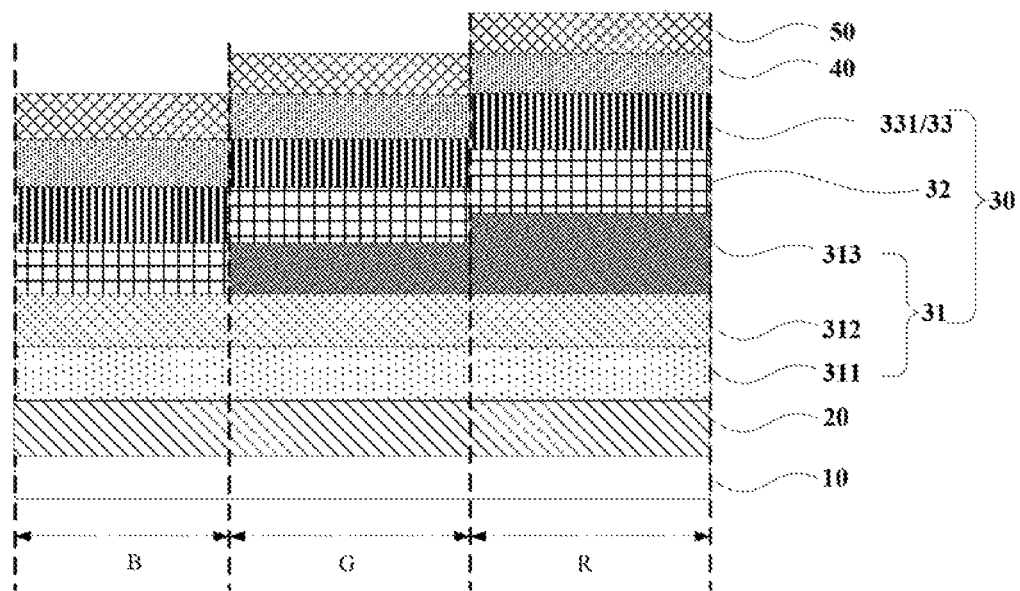
FIG. 4 illustrates a cross-sectional view of another exemplary OLED display panel according to the disclosed embodiments.

FIG. 4 illustrates a cross-sectional view of another exemplary OLED display panel according to the present disclosure. The similarities between FIG. 1 and FIG. 4 are not repeated here, while certain differences may be explained.

As shown in FIG. 4, the limiting function layer 30 of the OLED display panel may include a first auxiliary function layer 31, a light emitting material layer 32, and a second auxiliary function layer 33. The first auxiliary function layer 31, the light emitting material layer 32, and the second auxiliary function layer 33 of the OLED display panel may be formed by a vapor deposition process.

The first auxiliary function layer 31 may be a hole-type auxiliary function layer and may have a multi-layer structure. For example, the first auxiliary function layer 31 may include one or more of a hole injection layer 311, a hole transport layer 312, and an electron blocking layer (not shown). The second auxiliary function layer 33 may be an electron-type auxiliary function layer and may have a multi-layer structure as well. The second auxiliary function layer 33 may include one or more of an electron transport layer, an electron injection layer, and a hole blocking layer.

In one embodiment, as shown in FIG. 4, the first auxiliary function layer 31 includes a hole injection layer 311 and a hole transport layer 312, and the second auxiliary function layer 33 includes an electron transport layer 331.

Further, the light emitting material layer 32 may include a host material and a guest dopant material. For example, as shown in FIG. 4, the pixel regions may include a plurality of red pixel regions R, a plurality of green pixel regions G, and a plurality of blue pixel regions B. A red pixel region R emits red light, i.e. a red light-emitting pixel region R, a green pixel region G emits green light, i.e. a green light-emitting pixel region G and a blue pixel region B emits blue light, i.e. a blue light-emitting pixel region B.

At least one of the light-emitting material layer corresponding to the red light emitting pixel region R and the light emitting material layer corresponding to the blue light emitting pixel region B may use one or two host materials. The light emitting material layer corresponding to the green light emitting pixel region G may use at least two host materials. The colors and the number of the pixel regions in FIG. 4 are for illustrative purposes and are not intended to limit the scope of the present disclosure.

It is understood by those skilled in the art that the light-emitting material layer may have more host material content than guest dopant material content. Generally, the host material has an absolute highest occupied molecular orbital (HOMO) energy level |T_host(HOMO)| greater than an absolute highest occupied molecular orbital energy level |T_dopant(HOMO)| of the guest dopant material, the host material has an absolute lowest unoccupied molecular orbital (LUMO) energy level |T_host(LUMO)| smaller than an absolute lowest unoccupied molecular orbital energy level |T_dopant(LUMO)| of the guest dopant material, and the host material has a triplet energy level |T_host(S)| greater than a triplet energy level |T_dopant(S)| of the guest dopant material. The triplet exciton energy of the host material may be efficiently transferred to the light emitting guest material. The emission spectrum of the host material and the absorption spectrum of the guest dopant material may be energy matched.

Further, the guest dopant material of the light-emitting material may include a phosphorescent or fluorescent material. For example, both the light-emitting material layer corresponding to the red light-emitting pixel region R and the light-emitting material layer corresponding to the green light-emitting pixel region G may include a phosphorescent guest dopant material. The light-emitting material layer corresponding to the blue-light emitting pixel region B may include a fluorescent guest dopant material.

The material for the light emitting material layer are not limited by the present disclosure. For example, in another embodiment, the light-emitting material layer may be made of a non-host guest dopant material or a light-emitting material having a thermally activated delayed fluorescence (TADF) function.

In one embodiment, the first electrode 20 may include at least a reflective electrode layer for increasing the reflectance and improving the light utilization efficiency of the OLED display panel. For example, the first electrode 20 may include an indium tin oxide electro-conductive film, a reflective electrode layer (e.g., Ag), and an indium tin oxide electro-conductive film sequentially stacked together. The indium tin oxide electro-conductive film may be made of a high work function material, which is suitable for hole injection.

A micro-cavity structure may be formed between the first electrode 20 and the second electrode 40. The micro-cavity structure may be able to limit the light to a very small wavelength band region by the effects of reflection, total reflection, interference, diffraction, or scattering on the discontinuous interface of refractive index. By designing the cavity length and optimizing the thickness of each layer in the cavity, the central wavelength of the light emission may be located near the enhancement peak wavelength of the standing wave field to improve the coupling efficiency of the radiation dipole and the electric field in the cavity, such that the light emitting efficiency and brightness of the device may be improved.

Because light of different colors has different wavelengths, different effective cavity lengths may be configured for the cavity structures corresponding to different color pixel regions. The effective cavity length of a micro-cavity structure refers to an optical path length in the micro-cavity structure. The effective cavity length may be adjusted by the first auxiliary function layer 31, the light emitting material layer 32, and the second auxiliary function layer 33.

In one embedment, as shown in FIG. 4, the effective cavity length may be adjusted by the hole transport layer of the first auxiliary function layer 31, and the hole transport layer for adjusting the effective cavity length in the micro-cavity structure is called as a hole transport auxiliary layer 313. The hole transport auxiliary layer 313 may be disposed on the hole transport layers 312 of the red light-emitting unit R (i.e., red light-emitting pixel region R) and green light-emitting unit G (i.e., green light-emitting pixel region G). The hole transport auxiliary layer 313 corresponding to the red light emitting unit R may have a thickness greater than the thickness of the hole transport auxiliary layer 313 corresponding to the green light emitting unit G.

The thickness of the second electrode 40 may vary according to various application scenarios. In one embodiment, the second electrode 40 may have a thickness ranging approximately between 10 nm and 25 nm, which may balance the light-emitting efficiencies of light in different colors, and reduce the thickness and the resistance of the second electrode 40, thereby minimizing the power consumption of the OLED display panel.

In one embodiment, referring to FIG. 4, to increase the light-emitting efficiency of the OLED display panel, a light coupling organic layer 50 may be disposed on the side of the substrate facing away from the second electrode 40. The refractive index of the light coupling organic layer 50 may be greater than the refractive index of the second electrode 40. The combined total transmittance of the second electrode 40 and the light coupling organic layer 50 may be greater than or equal to about 60%. By coordinating the refractive indexes of the light coupling organic layer 50 and the second electrode 40, the brightness enhancement effect of the micro-cavity structure may be increased, and the light-emitting efficiency may be improved.

TABLE 1

External quantum efficiency for an OLED device with an existing second electrode (weight percentage of Mg:Ag = 10:1) and an exemplary OLED device with a MgAg alloy (weight percentage of Mg:Ag = 1:9) second electrode

| Wavelength (nm) | External quantum efficiency (MgAg alloy second electrode, weight percentage of Mg:Ag = 10:1) | External quantum efficiency (MgAg alloy second electrode, weight percentage of Mg:Ag = 1:9) |
|---|---|---|
| 450 | 8.47% | 9.10% |
| 530 | 26.50% | 30.00% |
| 610 | 28.70% | 35.20% |

Table 1 is the external quantum efficiency measurement result comparison table for an OLED device with an existing second electrode (weight percentage of Mg:Ag=10:1) and an exemplary OLED with a MgAg alloy (weight percentage of Mg:Ag=1:9) second electrode. Table 1 shows the external quantum efficiency measurement results for the OLED devices using the existing MgAg alloy (weight percentage of Mg:Ag=10:1) second electrode and the disclosed MgAg alloy (weight percentage of Mg:Ag=1:9) second electrode. For the convenience of comparison, the OLED devices using the two kinds of second electrodes have the same structure as shown in FIG. 4.

In particular, the first electrode 20 of the OLED device may be made of Ag, and may have a thickness of about 600 Å. The hole injection layer 311 may have a thickness of about 900 Å. The hole injection layer 311 may be formed of 4,4',4"-tris[(3-methylphenyl)phenylamino]triphenylamine (m-MTDATA). The hole transport layer 312 may have a thickness of about 300 Å, and may be formed of N,N'-diphenyl-N,N'-bis(3-methylphenyl)-1,1'-biphenyl-4,4'-diamine (TPD).

The hole transport auxiliary layer 313 corresponding to the green-light emitting pixel region G may have a thickness of about 300 Å. The hole transport auxiliary layer 313 corresponding to the red light emitting pixel region R may have a thickness of about 900 Å. The hole transport auxiliary layer 313 and the hole transport layer 312 may be made of a same material. The light emitting material layer 32 may have a thickness of about 300 Å. The light emitting material layer 32 may have a host-guest doping structure. The ratio of the host material over the guest material is about 5% by volume.

In the red light-emitting pixel region R in FIG. 4, the host material may be distyrylbenzene (DSB), and the guest dopant material may be tris(1-phenylquinoline) iridium (PQIr). In the green light-emitting pixel region G, the host material may be distyrylbenzene (DSB) and 1,3-bis(carbazol-9-yl) (mCP), and the guest dopant material may be tris(2-phenylpyridine)iridium (Ir(ppy)$_3$). In the blue light-emitting pixel region B, the host material may be distyrylbenzene (DSB), and the guest dopant material may be FIrpic.

The electron transport layer 331 has a thickness of about 300 Å. The electron transfer layer 331 is formed of 8-hydroxyquinoline aluminum. The second electrode 40 has a thickness of about 120 Å to 250 Å. The light coupling organic layer 50 has a thickness of about 600 Å. The light coupling organic layer 50 is made of LiF.

In the existing technology, the second electrode is made of MgAg alloy (weight percentage of Mg:Ag=10:1). That is, the weight percentage ratio of Mg over Ag is 10:1. The differences in transmittance at different wavelengths are substantially large, which generally may be greater than about 15%. When the second electrode made of MgAg alloy (weight percentage of Mg:Ag=10:1) is used in the OLED devices, referring to Table 1, the external quantum efficiencies for blue light, green light, and red light are 8.47%, 26.50%, and 28.70%, respectively.

In one embodiment, the weight percentage ratio of Mg and Ag for the second electrode in the measurement sample OLED device may be 1:9. The differences in transmittances at different wavelengths may satisfy the equations (4), (5), and (6). As a result, the differences in transmittances at different wavelengths may be substantially small. Referring to Table 1, the external quantum efficiencies for blue light, green light, and red light in the exemplary OLED device with a MgAg alloy (weight percentage of Mg:Ag=1:9) second electrode are 9.10%, 30.00%, and 35.20%, respectively.

Compared with the second electrode made of MgAg alloy (weight percentage of Mg:Ag=10:1) in the existing technology, the red light has the most obvious external quantum efficiency enhancement effect, followed by the green light. That is, the external quantum efficiency of the red light may be mostly improved. Based on the measurement results shown in Table 1, by reducing the differences in transmittances at respective wavelengths for the second electrode, the external quantum efficiencies at different wavelength bands of the LED device may be increased. Thus, the light emitting efficiency of the OLED display panel over the entire visible light range may be increased.

Figure 5:
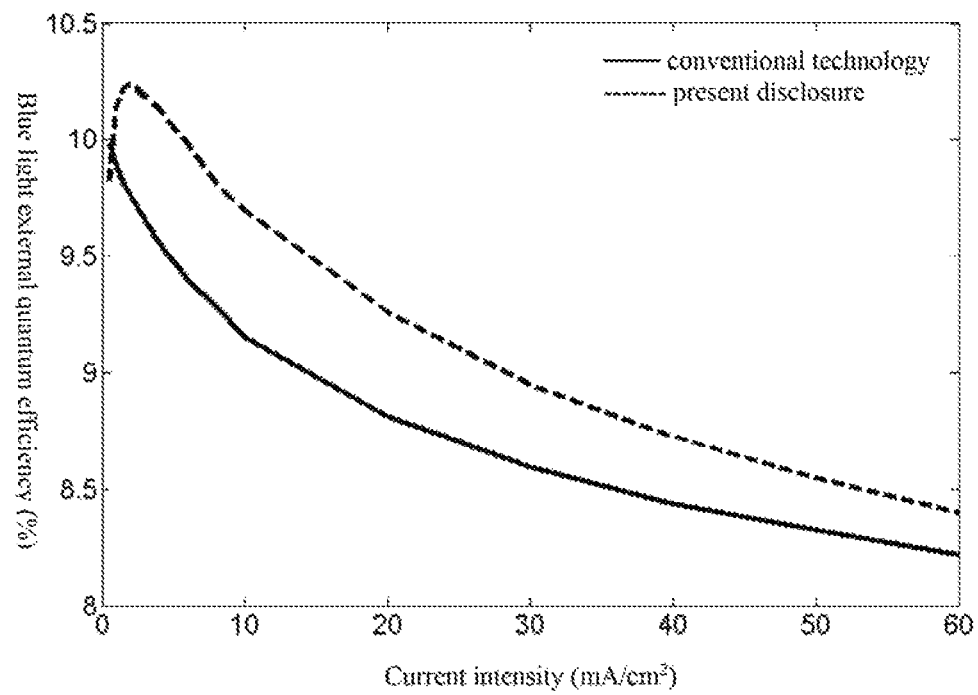
FIG. 5 illustrates a blue light external quantum efficiency vs current density measurement chart comparing an existing display panel and an exemplary OLED display panel according to the disclosed embodiments.

FIG. 5 illustrates a blue light external quantum efficiency vs current density measurement chart comparing an existing display panel and an exemplary OLED display panel according to the present disclosure. Referring to FIG. 5, in the existing technology, the second electrode is made of MgAg alloy (t weight percentage ratio of Mg and Ag is 10:1). In one embodiment, the second electrode of the OLED display panel is made of MgAg alloy (content weight percentage ratio of Mg and Ag is 1:9).

As shown in FIG. 5, given the same current intensity, the exemplary OLED display panel according to the present disclosure has a significantly increased blue light external quantum efficiency compared with the existing OLED display panel. It should be noted that the measurement samples in FIG. 5 have the same structure as shown in FIG. 4, and have the same thickness of each layer and same material as the OLED devices used in the external quantum efficiency measurement previously described in FIG. 4

Figure 6:
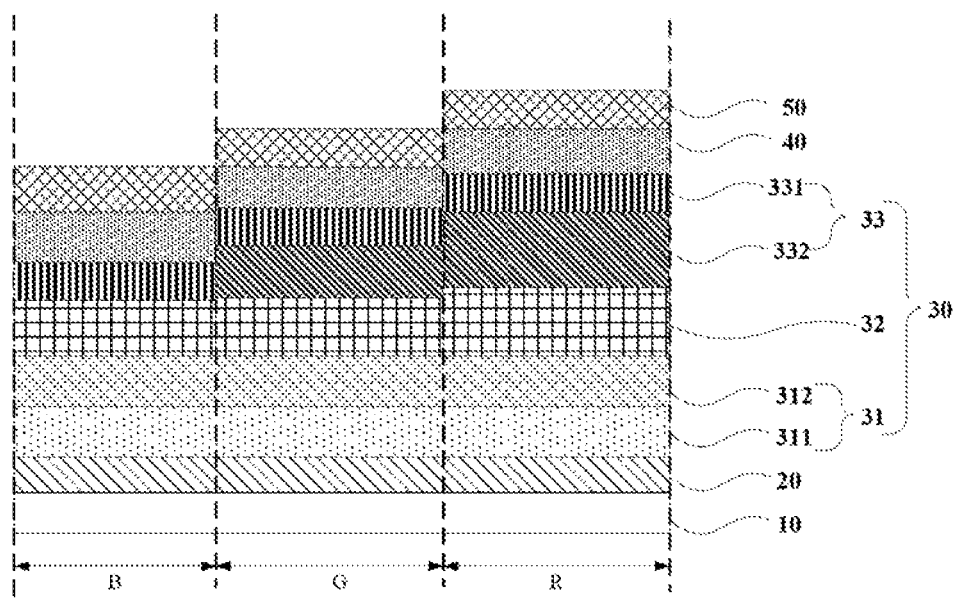
FIG. 6 illustrates a cross-sectional view of another exemplary OLED display panel according to the disclosed embodiments.

FIG. 6 illustrates a cross-sectional view of another exemplary OLED display panel according to the present disclosure. The similarities between FIG. 6 and FIG. 4 are not repeated here, while certain differences may be explained.

Referring to FIG. 6, different from the OLED display panel shown in FIG. 4, in the OLED display panel shown in FIG. 6, the electron transport layer of the second auxiliary function layer 33 may be configured to adjust the effective cavity length of the micro-cavity structure, and the electron transport layer for adjusting the effective cavity length of the micro-cavity structure is called as an electron transport auxiliary layer 332.

In one embodiment, as shown in FIG. 6, the electron transport auxiliary layer 332 may be disposed on the electron transport layer 331 in the red light-emitting unit R and the green light-emitting unit G, respectively. The electron transport auxiliary layer 332 corresponding to the red light-emitting unit R may have a thickness greater than the thickness of the electrode transport auxiliary layer 332 corresponding to the green light-emitting unit G.

The OLED display panel according to the present disclosure may be an active type OLED display panel or a passive type OLED display panel. The active type OLED display panel may include a plurality of light-emitting units, such as a plurality of red light-emitting units R, green light-emitting units G, and blue light-emitting units B. The first electrode of each light-emitting unit may be electrically insulated from each other. Each light-emitting unit may correspond to a thin film transistor (TFT). The thin film transistor may be electrically connected to the corresponding first electrode. Each thin film transistor may provide a driving signal to the corresponding light-emitting unit through the corresponding first electrode.

The passive type OLED display panel may include a plurality of light-emitting units. The light-emitting units in a same row may share a common first electrode. The light-emitting units in a same column may share a common second electrode. The first electrodes and the second electrodes may be intersecting each other and may be electrically insulated.

In the disclosed embodiments, through configuring desired small differences in transmittances in different wavelength bands of the second electrode, the efficiencies and color shifts in different wavelength bands may be consistent, and the differences in transmittances and light emitting-efficiency in different wavelength bands for the cathode material of the OLED display panel may be reduced. Thus, the light-emitting efficiency of the OLED display panel may be increased over the entire visible light range.

Figure 7:
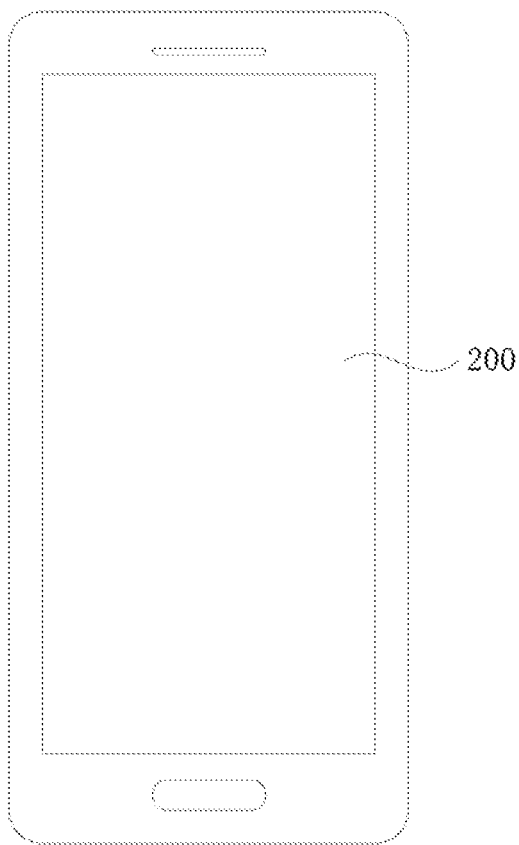
FIG. 7 illustrates a schematic view of an exemplary electronic device according to the disclosed embodiments.

The present disclosure also provides an electronic device. FIG. 7 illustrates a schematic view of an exemplary electronic device according to the present disclosure. As shown in FIG. 7, the electronic device includes an OLED display panel 200. The OLED display panel 200 may be any one of the disclosed OLED display panels. The electrode device may be a smart phone as shown in FIG. 7, a computer, a television set, or a smart wearable device, etc., which is not limited by the present disclosure.

Figure 8:
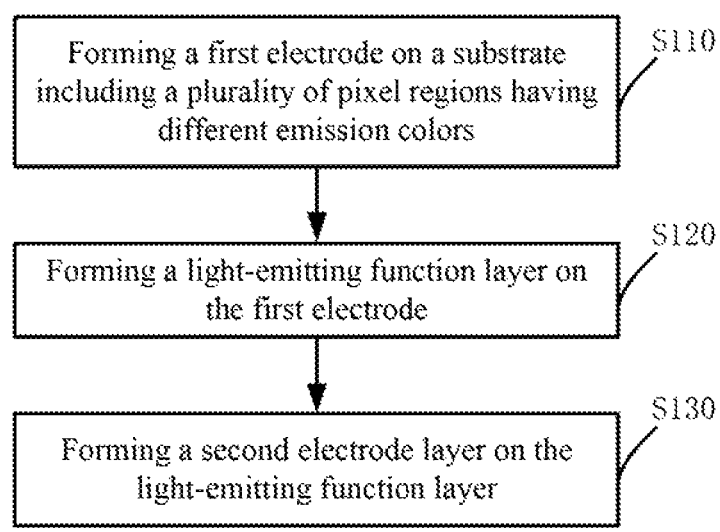
FIG. 8 illustrates a flow chart of an exemplary manufacturing method for an exemplary OLED display panel according to the disclosed embodiments.

The present disclosure also provides a manufacturing method for the OLED display panel. FIG. 8 illustrates a flow chart of an exemplary manufacturing method for an exemplary OLED display panel according to the present disclosure.

As shown in FIG. 8, at the beginning, a first electrode is formed on a substrate including a plurality of pixel regions having different emission colors (Si 10). The corresponding structure is shown in FIG. 4.

As shown FIG. 4, the first electrode 20 may be formed on the substrate 10 by vapor deposition, magnetron sputtering, or in jet printing. The material of the first electrode 20 may be a high work function conductive material to facilitate the injection of holes, such as indium tin oxide (ITO). The first electrode 20 may further include at least a reflective conductive layer for increasing the reflectivity. The reflective conductive layer may be made of an opaque metallic material, such as Ag.

In one embodiment, the first electrode 20 may include a first transparent conductive film, a reflective conductive film, and a second transparent conductive film, configured in this order.

The first and second transparent conductive films of the first electrode 20 may be made of a high work function material to facilitate the injection of holes. The reflective conductive film may be used to increase the reflectivity and the light utilization efficiency of the OLED display panel. In one embodiment, the first and second transparent conductive films may be made of ITO, the reflective conductive film may be made of Ag, the reflective conductive film may have a thickness greater than about 500 Å, and the first electrode may have a reflectivity greater than about 80%.

In certain embodiments, after the first electrode 20 is formed, a pixel defining layer may be formed. The pixel defining layer may include a plurality of opening structures. Each opening structure may correspond to a light-emitting unit.

In certain other embodiments, before the first electrode is formed, a pixel defining layer may be formed. The pixel defining layer may include a plurality of opening structures. A first electrode may be formed in each opening structure. The pixel defining layer may prevent color mixing in the subsequently formed light emitting material layer.

Returning to FIG. 8, after the first electrode is formed, a light-emitting function layer is formed on the first electrode (S 120). The corresponding structure is shown in FIG. 4.

As shown in FIG. 4, in one embodiment, the light-emitting function layer 30 may include a first auxiliary function layer 31, a light emitting material layer 32, and a second auxiliary function layer 33. The first auxiliary function layer 31 may have a multi-layer structure. For example, the first auxiliary function layer 31 may include a hole injection layer 311, a hole transport layer 312, an electron blocking layer (not shown), and a sub auxiliary function layer 313. The sub auxiliary function layer 313 may be a hole compensation layer to adjust the effective cavity lengths of the micro-cavity structures corresponding to different color emission pixel regions. The second auxiliary function layer 33 may have a multi-layer structure. The second auxiliary function layer 33 may include an electron transport layer 331, an electron injection layer (not shown), and a hole blocking layer (not shown).

For the light emitting units of different emission colors, the light emitting material layer 32 may be sequentially deposited by using masks. For illustration purpose, in one embodiment, the light-emitting function layer 30 may include light-emitting units emitting three different colors, such as a red light-emitting unit R emitting red light, a green light-emitting unit G emitting green light, and a blue light-emitting unit B emitting blue light. In another embodiment, the light-emitting function layer 30 may include light-emitting units emitting other emission colors, which are not limited by the present disclosure.

In certain embodiments, the thicknesses of the light emitting material layers 32 corresponding to the light emitting units of different emission colors may be the same. In certain other embodiments, the thicknesses of the light emitting material layers 32 corresponding to the light emitting units of different emission colors may be different. The thicknesses of the light emitting material layers 32 corresponding to the light-emitting units of different emission colors may be determined according to various factors, such as the actual manufacturing requirements, the micro-cavity structures corresponding to the light-emitting units of different emission colors, light-emitting layer characteristics, and the transport balances between holes and electrons in different light-emitting units, etc. The first auxiliary function layer 31 and the second auxiliary function layer 33 may balance between the electron injections and the hole injections, and ensure that the electrons and holes are recombined inside the light emitting material layer 32.

Returning to FIG. 8, after the light-emitting function layer is formed on the first electrode, a second electrode is formed on the light-emitting function layer (S 130). The corresponding structure is shown in FIG. 4.

In particular, the differences in transmittances at different wavelengths of the second electrode may satisfy the following equations:

$$|T(450\ nm) - T(530\ nm)| \leq 15\%; \qquad (1)$$

$$|T(610\ nm) - T(530\ nm)| \leq 15\%;\ and \qquad (2)$$

$$|T(400\ nm) - T(700\ nm)| \leq 50\%; \qquad (3)$$

where, $T(Xnm)$ is a transmittance at a wavelength Xnm of the second electrode.

The second electrode may be made of, for example, low work function conductive material to facilitate the injection of electrons.

In the disclosed embodiments, through configuring the absolute difference between a transmittance at the wavelength 450 nm of the second electrode and a transmittance at the wavelength 530 nm of the second electrode to be smaller than or equal to about 15%, the absolute difference between a transmittance at the wavelength 610 nm of the second electrode and a transmittance at the wavelength 530 nm of the second electrode to be smaller than or equal to about 15%, and the absolute difference between a transmittance at the wavelength 400 nm of the second electrode and a transmittance at the wavelength 700 nm of the second electrode to be smaller than or equal to about 50%, the differences of the transmittances in different light wavelength bands may be reduced, the efficiencies and color shifts in different light wavelength bands may be assured to be sufficiently consistent, the differences of the cathode material transmittances at different wavelengths for the OLED display panels may be minimized, and the light emitting efficiency of the OLED display panels over the entire visible light range may be improved.

The smaller the light emitting efficiency differences in transmittances in different wavelength bands of the cathode material of the OLED display panel, the higher the light emitting efficiency of the OLED display panel. In certain embodiments, the differences in transmittances in different wavelength bands of the second electrode 40 may satisfy the following equations:

$$|T(450\ nm) - T(530\ nm)| \leq 10\%; \qquad (4)$$

$$|T(610\ nm) - T(530\ nm)| \leq 10\%;\ and \qquad (5)$$

$$|T(400\ nm) - T(700\ nm)| \leq 40\%. \qquad (6)$$

where, $T(Xnm)$ is a transmittance at a wavelength Xnm of the second electrode 40.

In one embodiment, the second electrode 40 may be made of a metal alloy containing Ag. For example, the Ag containing metal alloy may further contain at least one of Mg element, Yb element, an alkali metal element, an alkaline earth metal element, or a rare earth element. The Ag content in the second electrode 40 material may be optionally configured to be greater than or equal to about 90%.

As the Ag content increases, the transmittance curve over the entire visible light range for the second electrode 40 made of metal alloy containing Ag may approach the transmittance curve over the entire visible light range for the second electrode 40 made of pure Ag. When the Ag content in the second electrode 40 material is greater than or equal to about 90%, the transmittance curve over the entire visible light range for the second electrode 40 made of metal alloy containing Ag becomes almost the same as the transmittance curve over the entire visible light range for the second electrode 40 made of pure Ag, and the equations (1), (2), and (3) may be satisfied. At the same time, the lowest transmittance over the visible light range of the second electrode 40 may be greater than or equal to about 40%.

In another embodiment, the second electrode 40 may be formed on the light-emitting function layer by a vacuum deposition method to mix Ag with other metals.

In another embodiment, the disclosed manufacturing method may also include forming a light coupling organic layer 50 on the second electrode 40. The light coupling organic layer 50 may have a refractive index greater than the second electrode 40. The combined total transmittance of the second electrode 40 and the light coupling organic layer 50 may be greater than or equal to about 60%.

The OLED display panel according to the present disclosure may be an active type OLED display panel or a passive type OLED display panel. The active type OLED display panel may include a plurality of light-emitting units, such as a plurality of red light-emitting units R, green light-emitting units G, and blue light-emitting units B. The first electrode of each light-emitting unit may be electrically insulated from each other. Each light-emitting unit corresponds to a thin film transistor (TFT). The TFT may be electrically connected to the corresponding first electrode. Each TFT may provide a driving signal to the corresponding light-emitting unit through the corresponding first electrode.

The passive type OLED display panel may include a plurality of light-emitting units. The light-emitting units in a same row share a common first electrode. The light-emitting units in a same column may share a common second electrode. The first electrodes and the second electrodes may be intersecting each other and may be electrically insulated.

In another embodiment, a micro-cavity structure may be formed between the first electrode 20 and the second electrode 40 in the light-emitting units. The micro-cavity structures corresponding to the light-emitting units of different emission colors may have different effective cavity lengths. The effective cavity length refers to an optical path length in the micro-cavity structure. The cavity length of the micro-cavity structure corresponding to the light-emitting unit may be positively correlated with the emission color wavelength corresponding to the light-emitting unit.

Due to the different wavelengths of different emission colors, the micro-cavity structures corresponding to the light-emitting units of different emission colors in the OLED display panel may have different effective cavity lengths. The effective cavity length of the micro-cavity structure corresponding to the green light-emitting unit G may be smaller than the effective cavity length of the micro-cavity structure corresponding to the red light-emitting unit R, but may be greater than the effective cavity length of the micro-cavity structure corresponding to the blue light-emitting unit B.

In another embodiment, the OLED display panel may include a plurality of light-emitting units. The light-emitting material layer corresponding to the red light emitting unit and the light-emitting material layer corresponding to the green light emitting unit may be made of a material containing phosphorescent material. The light-emitting material layer 32 corresponding to the blue light-emitting unit may be made of a material containing fluorescent material. At least one of the light-emitting material layer 32 corresponding to the red light emitting unit and the light-emitting material layer 32 corresponding to the blue light-emitting unit may be made of one or two host materials. The light emitting material layer 32 corresponding to the green light-emitting unit may be made of at least two host materials.

In the disclosed embodiments, through configuring desired small differences in transmittances in different wavelength bands of the second electrode, the efficiencies and color shifts in different wavelength bands may be consistent, and the differences in transmittances and light emitting-efficiency in different wavelength bands for the cathode material of the OLED display panel may be reduced. Thus, the light-emitting efficiency of the OLED display panel may be increased over the entire visible light range.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. An organic light-emitting diode (OLED) display panel, comprising:
  a substrate; and
  a plurality of pixel regions formed on the substrate to emit light of different colors, wherein:
  a pixel region includes a first electrode, a light-emitting function layer, and a second electrode, configured facing away from the substrate;
  the second electrode is a light-emitting side electrode of the OLED display panel;
  a light coupling organic layer is formed on a side of the second electrode facing away from the substrate and a refractive index of the light coupling organic layer is greater than a refractive index of the second electrode;
  differences in transmittances at different wavelengths of the second electrode satisfy the following equations:

$|T(450\ nm) - T(530\ nm)| \le 15\%$, $|T(610\ nm) - T(530\ nm)| \le 15\%$, and $|T(400\ nm) - T(700\ nm)| \le 50\%$, where $T(X\,nm)$ is a transmittance at a wavelength of Xnm of the second electrode;
  a micro-cavity structure is formed between the first electrode and the second electrode in each pixel region and the micro-cavity structures corresponding to the pixel regions of different emission colors have different effective cavity lengths, wherein the effective cavity length of the micro-cavity structure refers to an optical path length in the micro-cavity structure;
  the second electrode is made of Ag or a metal alloy containing Ag; and
  the metal alloy containing Ag has an Ag content greater than or equal to about 90% by weight percentage.

2. The OLED display panel according to claim 1, wherein:
  the differences in the transmittance at different wavelengths of the second electrode satisfy the following equations:

$|T(450\ nm) - T(530\ nm)| \le 10\%$;

$|T(610\ nm) - T(530\ nm)| \le 10\%$; and $|T(400\ nm) - T(700\ nm)| \le 40\%$.

3. The OLED display panel according to claim 1, wherein:
  a lowest transmittance over the visible light range of the second electrode is greater than or equal to about 40%.

4. The OLED display panel according to claim 1, wherein:
  the metal alloy containing Ag also contains at least one of Mg element, Yb element, an alkali metal element, an alkali earth metal element, or a rare earth element.

5. The OLED display panel according to claim 1, wherein:
  the second electrode has a thickness ranging approximately between 10 nm and 25 nm.

6. The OLED display panel according to claim 1, wherein:
  the light-emitting function layer includes a first auxiliary function layer, a light emitting material layer, and a second auxiliary function layer.

7. The OLED display panel according to claim 1, wherein:
  the light-emitting function layer includes a light-emitting material layer;
  the light-emitting material layer corresponding to a red light-emitting pixel region and the light emitting material layer corresponding to a green light-emitting pixel region each is made of a material containing phosphorescent material; and
  the light emitting material corresponding to a blue light-emitting pixel region is made of a material containing fluorescent material.

8. The OLED display panel according to claim 1, wherein:
  a combined total transmittance of the second electrode and the light coupling organic layer is greater than or equal to about 60%.

9. The OLED display panel according to claim 1, wherein:
  the light-emitting function layer includes a light-emitting material layer;
  at least one of the light-emitting material layer corresponding to a red light emitting pixel region and the light-emitting material layer corresponding to a blue light-emitting pixel region include one or two host materials; and
  the light-emitting material corresponding to a green light emitting pixel region includes at least two host materials.

10. The OLED display panel according to claim 1, wherein the light-emitting function layer further includes:

the light-emitting function layer further includes a first auxiliary function layer including one or more of a hole injection layer, a hole transport layer, and an electron blocking layer;
a light-emitting material layer; and
a second auxiliary function layer including one or more of an electron transport layer, an electron injection layer, and a hole blocking layer,
wherein the hole injection layer has a thickness of about 900 Å and is formed of 4,4',4"-tris[(3-methylphenyl) phenylamino]triphenylamine (m-MTDATA),
the hole transport layer has a thickness of about 300 Å and is formed of N,N'-diphenyl-N,N'-bis(3-methylphenyl)-1,1'-biphenyl-4,4'-diamine (TPD),
the light-emitting material layer has a thickness of about 300 Å and a host-guest doping structure, and a ratio of a host material over a guest material is about 5% by volume, and
the electron transport layer has a thickness of about 300 Å and is formed of 8-hydroxyquinoline aluminum.

11. An electronic device, comprising an OLED display panel, wherein the OLED display panel comprising:
a substrate; and
a plurality of pixel regions formed on the substrate to emit light of different colors, wherein:
a pixel region includes a first electrode, a light-emitting function layer, and a second electrode, configured facing away from the substrate;
the second electrode is a light-emitting side electrode of the OLED display panel;
a light coupling organic layer is formed on a side of the second electrode facing away from the substrate and a refractive index of the light coupling organic layer is greater than a refractive index of the second electrode;
differences in transmittances at different wavelengths of the second electrode satisfy the following equations:

$|T(450 \text{ nm}) - T(530 \text{ nm})| \leq 15\%$, $|T(610 \text{ nm}) - T(530 \text{ nm})| \leq 15\%$, and $|T(400 \text{ nm}) - T(700 \text{ nm})| \leq 50\%$, where T(Xnm) is a transmittance at a wavelength of Xnm of the second electrode;
a micro-cavity structure is formed between the first electrode and the second electrode in each pixel region and the micro-cavity structures corresponding to the pixel regions of different emission colors have different effective cavity lengths, wherein the effective cavity length of the micro-cavity structure refers to an optical path length in the micro-cavity structure;
the second electrode is made of Ag or a metal alloy containing Ag; and
the metal alloy containing Ag has an Ag content greater than or equal to about 90% by weight percentage.

12. A method for manufacturing a light emitting display panel, comprising:
forming a first electrode on a substrate including a plurality of pixel regions having different emission colors;
forming a light-emitting function layer on the first electrode; and
forming a second electrode layer on the light-emitting function layer,
forming a light coupling organic layer on a side of the second electrode facing away from the substrate, wherein a refractive index of the light coupling organic layer is greater than a refractive index of the second electrode;
wherein differences in transmittances at different wavelengths of the second electrode satisfy the following equations:

$|T(450 \text{ nm}) - T(530 \text{ nm})| \leq 15\%$;

$|T(610 \text{ nm}) - T(530 \text{ nm})| \leq 15\%$; and $|T(400 \text{ nm}) - T(700 \text{ nm})| \leq 50\%$, where T(Xnm) is a transmittance at a wavelength of Xnm of the second electrode;
a micro-cavity structure is formed between the first electrode and the second electrode in each pixel region and the micro-cavity structures corresponding to the pixel regions of different emission colors have different effective cavity lengths, wherein the effective cavity length of the micro-cavity structure refers to an optical path length in the micro-cavity structure;
the second electrode is made of Ag or a metal alloy containing Ag; and
the metal alloy containing Ag has an Ag content greater than or equal to about 90% by weight percentage.

13. The method according to claim 12, wherein:
the differences in the transmittance at different wavelengths of the second electrode satisfy the following equations:

$|T(450 \text{ nm}) - T(530 \text{ nm})| \leq 10\%$;

$|T(610 \text{ nm}) - T(530 \text{ nm})| \leq 10\%$; and $|T(400 \text{ nm}) - T(700 \text{ nm})| \leq 40\%$.

14. The method according to claim 12, wherein:
the metal alloy containing Ag also contains at least one of Mg element, Yb element, an alkali metal element, an alkali earth metal element, or a rare earth element.

15. The method according to claim 12, wherein:
the second electrode is formed on the light-emitting function layer by a vacuum deposition method to mix Ag with other metals.

* * * * *